United States Patent
Hayashi

(10) Patent No.: US 8,358,556 B2
(45) Date of Patent: Jan. 22, 2013

(54) INTERNAL POWER SUPPLY CIRCUIT, SEMICONDUCTOR DEVICE, AND MANUFACTURING METHOD OF SEMICONDUCTOR DEVICE

(75) Inventor: Koichiro Hayashi, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 297 days.

(21) Appl. No.: 12/787,023

(22) Filed: May 25, 2010

(65) Prior Publication Data

US 2010/0301949 A1 Dec. 2, 2010

(30) Foreign Application Priority Data

May 29, 2009 (JP) .................................. 2009-129840

(51) Int. Cl.
*G11C 5/14* (2006.01)

(52) U.S. Cl. ........ 365/226; 365/227; 327/536; 327/540; 327/544; 327/548

(58) Field of Classification Search .................. 365/226, 365/227; 327/536, 540, 544, 548
See application file for complete search history.

(56) References Cited

U.S. PATENT DOCUMENTS

| | | | |
|---|---|---|---|
| 5,982,163 A | 11/1999 | Shinozaki | |
| 6,417,726 B1 | 7/2002 | Kitade | |
| 6,456,555 B2 * | 9/2002 | Sim et al. | 365/226 |
| 7,490,018 B2 | 2/2009 | Inukai et al. | |
| 7,586,360 B2 * | 9/2009 | Jung | 327/536 |
| 2005/0169087 A1 * | 8/2005 | Kono et al. | 365/226 |
| 2006/0250179 A1 * | 11/2006 | Lee | 327/541 |

FOREIGN PATENT DOCUMENTS

| | | |
|---|---|---|
| JP | 3398564 A | 10/1998 |
| JP | 2002-184178 A | 6/2002 |
| JP | 2007-281139 A | 10/2007 |

* cited by examiner

*Primary Examiner* — Toan Le
(74) *Attorney, Agent, or Firm* — Sughrue Mion, PLLC

(57) ABSTRACT

To provide an internal power supply circuit that supplies a power supply voltage to an internal circuit of a semiconductor device via an internal power supply wiring, the internal power supply circuit includes a plurality of power supply units connected in common to the internal power supply wiring and an internal-power-supply control circuit that selects either activation or deactivation with regard to at least a part of the power supply units.

19 Claims, 8 Drawing Sheets

INTERNAL POWER SUPPLY CIRCUIT, SEMICONDUCTOR DEVICE, AND MANUFACTURING METHOD OF SEMICONDUCTOR DEVICE

BACKGROUND OF THE INVENTION

1. Field of the Invention

The present invention relates to an internal power supply circuit, a semiconductor device, and a manufacturing method of a semiconductor device, and more particularly relates to an internal power supply circuit, a semiconductor device, and a manufacturing method of a semiconductor device which are capable of optimizing a consumption current in the internal power supply circuit.

2. Description of Related Art

Semiconductor devices such as DRAMs (Dynamic Random Access Memories) are configured to operate using an internal power supply voltage obtained by raising or lowering an external power supply voltage, in addition to a voltage input from outside (the external power supply voltage). The actual value of the internal power supply voltage sometimes deviates from a design value due to manufacturing variability or the like, and thus it is adjusted at the time of manufacturing by fuse trimming or the like (see Japanese Patent Application Laid-open Nos. 2002-184178 and 2007-281139, and Japanese Patent No. 3398564).

For example, an internal power supply circuit described in Japanese Patent Application Laid-open No. 2002-184178 includes a reference-potential generating circuit that generates a reference potential and a driver circuit that supplies an internal power supply voltage based on the reference potential, where an adjustment of the reference potential is enabled by trimming a fuse included in the reference-potential generating circuit. In this manner, the level of the internal power supply voltage that varies in conjunction with the reference potential can be adjusted.

However, the current supply capability of the internal power supply voltage is not always optimal even when its level is adjusted. That is, because current supply capabilities of driver circuits are also individually different due to their manufacturing process, it is necessary to set the design value of the current supply capability larger than the minimum required value to some extent. As a result, the current supply capability of the internal power supply circuit can be excessive and generate a wasteful consumption current in the internal power supply circuit.

SUMMARY

In one embodiment, there is provided an internal power supply circuit that supplies a power supply voltage to an internal circuit of a semiconductor device via an internal power supply wiring, the internal power supply circuit comprising: a plurality of power supply units connected in common to the internal power supply wiring; and a control circuit that activates or deactivates each of at least a part of the power supply units.

In another embodiment, there is provided an internal power supply circuit that supplies a power supply voltage to an internal circuit of a semiconductor device, the internal power supply circuit comprising: an oscillator circuit that generates a periodic signal having a predetermined cycle; a pumping circuit that generates the power supply voltage by charging and discharging one or more capacitors using the periodic signal generated by the oscillator circuit; and a control circuit that controls drive capability of the oscillator circuit.

In still another embodiment, there is provided a semiconductor device comprising: an internal circuit operated by a power supply voltage supplied via an internal power supply wiring; and an internal power supply circuit supplying the power supply voltage to the internal power supply wiring, wherein the internal power supply circuit comprising: a plurality of power supply units connected in common to the internal power supply wiring; and a control circuit that activates or deactivates each of at least a part of the power supply units.

In still another embodiment, there is provided a manufacturing method of a semiconductor device having an internal power supply circuit, the internal power supply circuit includes: a plurality of power supply units connected in common to an internal power supply wiring that supplies a power supply voltage to an internal circuit of the semiconductor device; and a storage circuit that stores activation information of each of at least a part of the power supply units, wherein the method comprising: activating a part or all of the power supply units; measuring current supply capability of the internal power supply circuit; and writing the activation information into the storage circuit based on a measurement result.

In still another embodiment, there is provided a manufacturing method of a semiconductor device having an internal power supply circuit configured to be capable of controlling a value of a current for generating an internal power supply voltage according to bit data, the method comprising: maintaining first bit data that sets the value of the current within a first range at a first temperature; and determining whether a value of a current in the internal power supply circuit corresponding to the first bit at a second temperature, which is higher than the first temperature, falls within the first range.

According to the present invention, the current supply capability of the internal power supply circuit can be set within an optimal range. Therefore, there will be no excess in the current supply capability of the internal power supply circuit, and thus generation of a wasteful consumption current can be prevented.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Preferred embodiments of the present invention will now be explained in detail with reference to the drawings.

Figure 1:
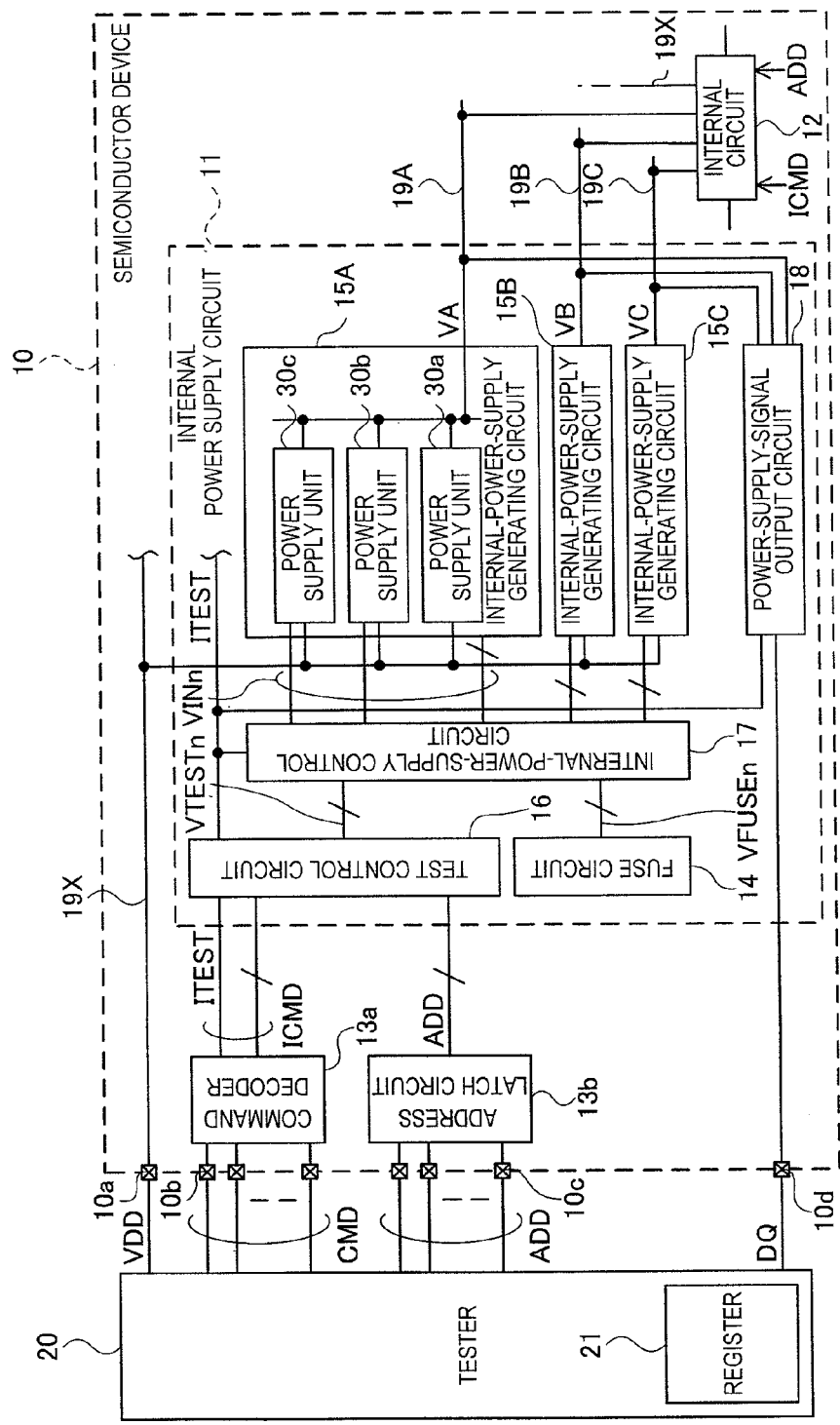
FIG. 1 is a schematic block diagram of functional blocks of a semiconductor device according to an embodiment of the present invention and of functional blocks of a tester which tests the semiconductor device.

FIG. 1 is a schematic block diagram of functional blocks of a semiconductor device 10 according to a first embodiment of the present invention and of functional blocks of a tester 20, which tests the semiconductor device 10.

The semiconductor device 10 is a semiconductor storage device such as a DRAM (Dynamic Random Access Memory), an SRAM (Static Random Access Memory), or a FLASH memory. As shown in FIG. 1, the semiconductor device 10 includes an internal power supply circuit 11, an internal circuit 12, a command decoder 13a, and an address latch circuit 13b. The semiconductor device 10 also includes a power supply terminal 10a, a command terminal 10b, an address terminal 10c, and a data input/output terminal 10d as its external terminals. The power supply terminal 10a has an external power supply voltage VDD supplied thereto, and the supplied external power supply voltage VDD is provided for the internal power supply circuit 11 or the internal circuit 12 via an external power supply wiring 19X. The command terminal 10b and the address terminal 10c are terminals having a command CMD and an address ADD input thereto, respectively. The data input/output terminal 10d that inputs and outputs data DQ to and from the internal circuit 12 is also used as a monitor terminal of the internal power supply circuit 11 at a test mode (described below).

The internal power supply circuit 11 is a circuit that generates one or plural internal power supply voltages VA to VC from the external power supply voltage VDD and outputs them to the internal circuit 12 of the semiconductor device 10. The internal power supply circuit 11 includes a circuit corresponding to a step-down regulator that generates an internal power supply voltage VXX having a lower voltage value than that of the external power supply voltage VDD, or a circuit corresponding to a VPP generator that generates an internal power supply voltage VPP having a high voltage value than the external power supply voltage VDD. Details of the internal power supply circuit 11 are described below.

The internal circuit 12 is a circuit that realizes main functions of the semiconductor device 10. For example, when the semiconductor device 10 is a DRAM, memory cell arrays and peripheral circuits thereof correspond to the internal circuit 12. Other than the external power supply voltage VDD supplied from outside, the internal power supply voltages VA to VC supplied from the internal power supply circuit 11 are used as an operation power supply of the internal circuit 12.

The command decoder 13a is a circuit that decodes the command CMD supplied from outside and generates various internal commands ICMD. The generated internal commands ICMD are supplied to the internal power supply circuit 11 and the internal circuit 12. When the semiconductor device 10 is a DRAM, the command CMD includes a test command for entry into a test mode, as well as an active command, a read command, a write command, a pre-charge command. Among the internal commands ICMD, a command ITEST indicating a test mode is supplied to the internal power supply circuit 11.

The address latch circuit 13b is a circuit that latches the address ADD supplied from outside and supplies the address to the internal circuit 12. When the address latch circuit 13b is in the test mode, the latched address ADD is supplied to the internal power supply circuit 11 and used as a test code signal VTESTn (n is a natural number) described below.

The internal power supply circuit 11 is explained below in detail.

As shown in FIG. 1, the internal power supply circuit includes a fuse circuit 14, internal-power-supply generating circuits 15A to 15C, a test control circuit 16, an internal-power-supply control circuit 17, and a power-supply-signal output circuit 18.

The fuse circuit 14 is a storage circuit that includes a plurality of fuses, and stores a code signal VFUSEn (n is a natural number) in a non-volatile manner by fuse trimming in a manufacturing process. The code signal VFUSEn is a code signal (activation information of each power supply unit expressed as bit data) that indicates a power supply unit to be activated among power supply units 30b and 30c (described below) in each internal-power-supply generating circuit.

The internal-power-supply generating circuits 15A to 15C receive the external power supply voltage VDD supplied from the external power supply wiring 19X and respectively generate the internal power supply voltages VA to VC. Each of the internal-power-supply generating circuits 15A to 15C corresponds to the step-down regulator and the VPP generator mentioned above. The internal-power-supply generating circuits 15A to 15C are respectively connected to different internal power supply wirings 19A to 19C, and supply the internal power supply voltages VA to VC to the corresponding internal power supply wirings. The number of internal-power-supply generating circuits is not limited to three.

The internal-power-supply generating circuit 15A includes a plurality of power supply units 30a to 30c connected in common to the internal power supply wiring 19A, as shown in FIG. 1. Each of the power supply units 30a to 30c has a predetermined current supply capability, and the power supply units 30b to 30c are configured to be individually activatable by a code signal VINn described below. The number of power supply units included in one internal-power-supply generating circuit is not limited to three, and can be any number equal to or larger than two.

The current supply capability of the internal-power-supply generating circuit 15A is maximized when all of the power supply units 30a to 30c are activated. When only a part of the power supply units is activated, the sum of the current supply capability of the activated power supply units is the current supply capability of the internal-power-supply generating circuit 15A. It is preferred to differentiate the current supply capability of the power supply units 30a to 30C from each other, so that the current supply capability can be switched for multiple levels.

In a specific example where the internal-power-supply generating circuit 15A is the step-down regulator mentioned above, the power supply units 30a to 30c respectively include driver transistors connected between the external power supply wiring 19X and the internal power supply wiring 19A. In this case, it is preferred to differentiate the sizes of the driver transistors from each other to obtain a multilevel current supply capability. When the internal-power-supply generating circuit 15A is the VPP generator mentioned above, the power supply units 30a to 30c respectively include capacitors of a pumping circuit. In this case, it is preferred to differentiate the sizes of the capacitors from each other to obtain the multilevel current supply capability. Details thereof are described below.

While the power supply units 30a to 30c are shown only for the internal-power-supply generating circuit 15A in FIG. 1, the internal-power-supply generating circuits 15B and 15C also include a plurality of power supply units.

The test control circuit 16 outputs the address ADD as the test code signal VTESTn when the test signal ITEST is activated. The test signal ITEST is activated in the test mode and output to the internal-power-supply control circuit 17, the internal circuit 12, and the power-supply-signal output circuit 18 via the test control circuit 16. Similarly to the code signal VFUSEn, the test code signal VTESTn indicates the power supply unit to be activated among the power supply units 30b and 30c in each internal-power-supply generating circuit, and is output to the internal-power-supply control circuit 17.

The internal-power-supply control circuit 17 is a circuit that selects either activation or deactivation with regard to at least a part of the power supply units 30a to 30c for each internal-power-supply generating circuit. Specifically, the code signal VINn (n is a natural number) indicating the power supply unit to be activated among the power supply units 30b and 30c in each internal-power-supply generating circuit is output to each of the internal-power-supply generating circuits 15A to 15C. Each of the internal-power-supply generating circuits 15A to 15C activates the power supply unit according to the code signal VINn.

The internal-power-supply control circuit 17 selects either the test code signal VTESTn output from the test control circuit 16 or the fuse code signal VFUSEn output from the fuse circuit 14, and outputs the selected one to each of the internal-power-supply generating circuits 15A to 15C as the code signal VINn. Specifically, in a normal operation mode where the test mode has not been entered, the fuse code signal VFUSEn is selected and output to each of the internal-power-supply generating circuits 15A to 15C as the code signal VINn. Meanwhile, when the internal-power-supply control circuit 17 is in the test mode (a period during which the test signal ITEST is activated), the test code signal VTESTn is selected and output to each of the internal-power-supply generating circuits 15A to 15C as the code signal VINn.

The power-supply-signal output circuit 18 is a circuit that connects the internal power supply wirings 19A to 19C to the data input/output terminal 10d in response to activation of the test signal ITEST. When the internal power supply wirings 19A to 19C are connected to the data input/output terminal 10d, the tester 20 is enabled to individually and directly monitor the current supplied by the internal-power-supply generating circuits 15A to 15C.

The configuration of the semiconductor device 10 is as described above.

The tester 20 is a device that performs a current measurement test of the semiconductor device 10 in a wafer state. The tester 20 supplies a test command to the semiconductor device 10 via the command terminal 10b, and also supplies the address signal ADD for generating a test code signal to the semiconductor device 10 via the address terminal 10c. During testing, the tester 20 monitors the capability of the internal power supply circuit 11 via the data input/output terminal 10d, and update the address signal ADD for generating a test code signal based on the capability. At the time of the test, the tester 20 also supplies the external power supply voltage VDD to the semiconductor device 10 via the power supply terminal 10a.

The tester 20 includes a register 21. The register 21 is a storage unit that stores various data used for a test or data obtained as a result of the test. The various data used for a test includes data indicating an optimal range of the current supply capability of each internal-power-supply generating circuit.

An adjusting operation of the current supply capability is described below in detail with reference to a flowchart in FIG. 2. While the following descriptions are focused only on the internal-power-supply generating circuit 15A, similar processing is performed on the internal-power-supply generating circuits 15B and 15C.

Figure 2:
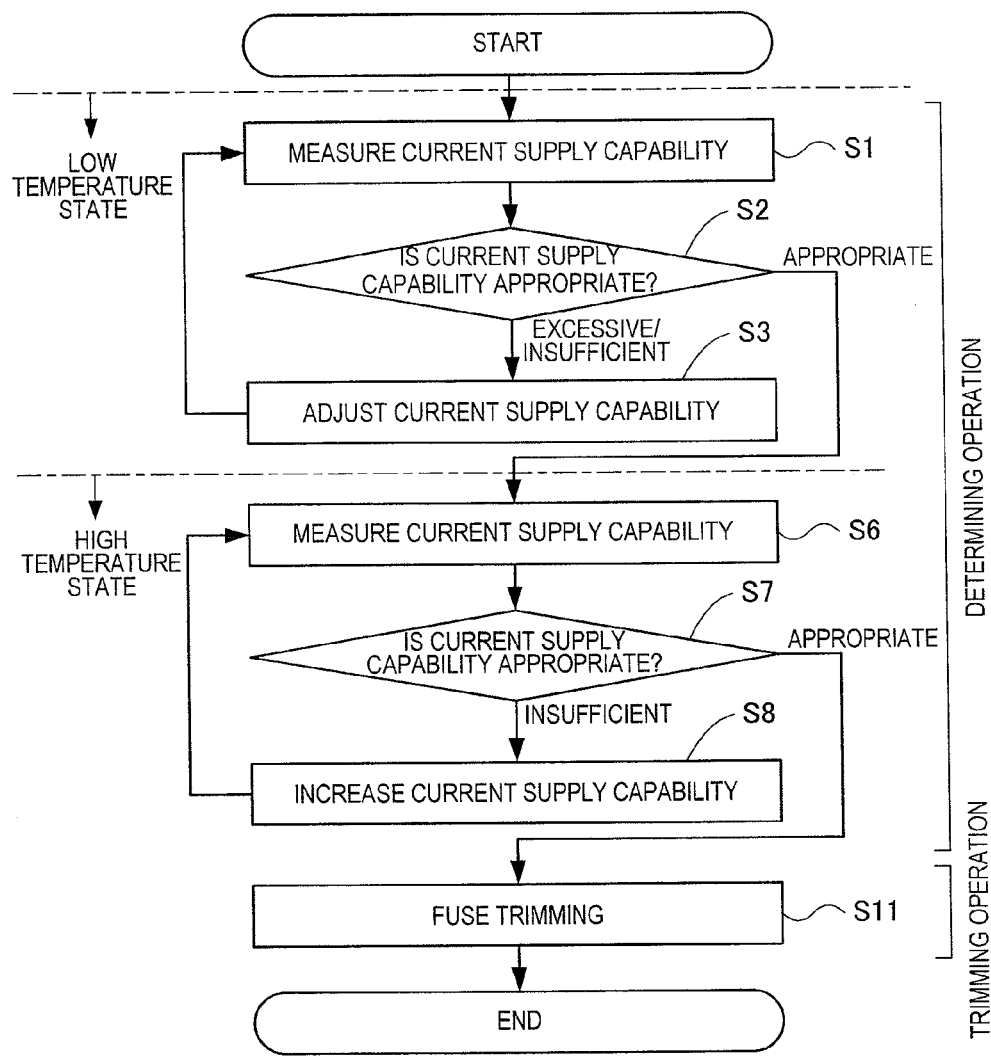
FIG. 2 is a flowchart of an adjusting operation of the current supply capability of a semiconductor device according to an embodiment of the present invention.

FIG. 2 is a flowchart of an adjusting operation of the current supply capability. The adjusting operation of the current supply capability can be generally classified into a determining operation using the tester 20 and a write operation into the fuse circuit 14 using a trimming device (not shown).

In the determining operation using the tester 20, first, the ambient temperature of the semiconductor device 10 is set low (a minimum temperature within a guaranteed operating range, such as −10° C.). Next, the tester 20 supplies a test command to the semiconductor device 10 via the command terminal 10b. The semiconductor device 10 thereby enters a test mode and the test signal ITEST is activated. In this state, the tester 20 supplies the test code signal VTESTn to the semiconductor device 10 via the address terminal 10c. A predetermined value stored in the register 21 can be used as the value of the test code signal VTESTn to be initially provided. The tester 20 monitors the current output from the power-supply-signal output circuit 18 in the low temperature state, and measures the current supply capability of the internal-power-supply generating circuit 15A (step S1).

Based on a measurement result, the tester 20 determines whether the current supply capability of the internal-power-supply generating circuit 15A is appropriate (step S2). Specifically, the tester 20 determines whether the current supply capability is appropriate, excessive, or insufficient by comparing the data indicating an optimal range of the current supply capability of each internal-power-supply generating circuit stored in the register 21 in advance and the measurement result. When the current supply capability falls within the optimal range, the tester 20 determines the capability to be "appropriate".

The optimal range of the current supply capability differs depending on the type of the internal power supply voltage. For example, a range of 200 mA to 300 mA is generally the optimal range of the current supply capability for the internal power supply voltage VPERI used by peripheral circuits of a DRAM. On the other hand, a range of 10 mA to 20 mA is generally the optimal range of the current supply capability for the internal power supply voltage VPP. In terms of reducing the consumption current, it is preferred that the upper limit of the optimal range of the current supply capability is set to a value as small as possible.

As a result of the comparison, when the current supply capability of the internal-power-supply generating circuit 15A is determined as not appropriate, that is, when the current supply capability is excessive or insufficient, the tester adjusts the current supply capability of the internal-power-supply generating circuit 15A (step S3). Specifically, this adjustment is performed by updating the test code signal VTESTn (or VINn) output from the tester 20, and switching the power supply unit to be activated among the power supply units 30a to 30c. That is, the power supply unit to be activated is switched to reduce the total current supply capability when the current supply capability of the internal-power-supply generating circuit 15A is excessive. On the other hand, when the current supply capability is insufficient, the power supply unit to be activated is switched to increase the total current supply capability. After this adjustment, the operation returns to step S1, and measurement of the current supply capability is performed.

As a result of determination at step S2, when the current supply capability of the internal-power-supply generating circuit 15A falls within the optimal range (when it is appropriate), the tester 20 stores the test code signal VTESTn in the register 21 temporarily. Next, the ambient temperature of the semiconductor device 10 is set high (the highest temperature within the guaranteed operating range, such as 90° C.). In the high temperature state, the tester 20 measures the current supply capability of the internal-power-supply generating circuit 15A again (step S6). The value temporarily stored in the register 21 is used as the value of the test code signal VTESTn to be initially provided at step S6. The tester 20 compares the data indicating the optimal range mentioned above with the measurement result again (step S7) and, as a result, when the current supply capability is insufficient, the tester 20 increase the current supply capability of the internal-power-supply generating circuit 15A (step S8). Specifically, the power supply unit to be activated is switched to increase the total current supply capability by updating the test code signal VTESTn (or VINn) output from the tester 20.

Only the process of increasing the capability is described at step S8, because the current supply capability of the internal-power-supply generating circuit 15A usually has a characteristic of decreasing as the ambient temperature rises. However, it is preferred to decrease the current supply capability of the internal-power-supply generating circuit 15A when it is determined as the result of the measurement at step S5 that the current supply capability is excessive.

When the current supply capability of the internal-power-supply generating circuit 15A falls within the optimal range (when it is appropriate) as the result of the determination at step S7, the tester 20 temporarily stores the test code signal VTESTn in the register 21. The determining operation using the tester 20 is thus completed.

Finally, the test code signal VTESTn finally obtained as the result of the above process is transmitted to a trimming device (not shown) from the tester 20. The trimming device performs fuse trimming of the fuse circuit 14 based on the received test code signal VTESTn (step S11). That is, the fuse trimming of the fuse circuit 14 is performed so that the value of the fuse code signal VFUSEn output from the fuse circuit 14 becomes identical to the finally obtained test code signal VTESTn (VINn). Accordingly, activation information of each power supply unit (information indicating whether to activate) is written into the fuse circuit 14.

As described above, according to the semiconductor device 10 of the first embodiment, it becomes possible to set the current supply capability of the internal-power-supply generating circuits 15A to 15C within the optimal range by fuse trimming. Therefore, generation of a wasteful consumption current can be prevented because the actual current supply capability does not become excessive while the current supply capability of the internal-power-supply generating circuits 15A to 15C is designed to be slightly excessive while considering manufacturing variability.

An adjustment of the current supply capability of the internal-power-supply generating circuit is described next in detail, exemplifying a specific configuration of an internal-power-supply generating circuit. In the following explanations, the internal-power-supply generating circuits 15A and 15B are respectively described, assuming that the internal-power-supply generating circuit 15A is a step-down regulator that generates the internal power supply voltage VXX (<VDD), and the internal-power-supply generating circuit 15B is a VPP generator that generates the internal power supply voltage VPP (>VDD).

Figure 3:
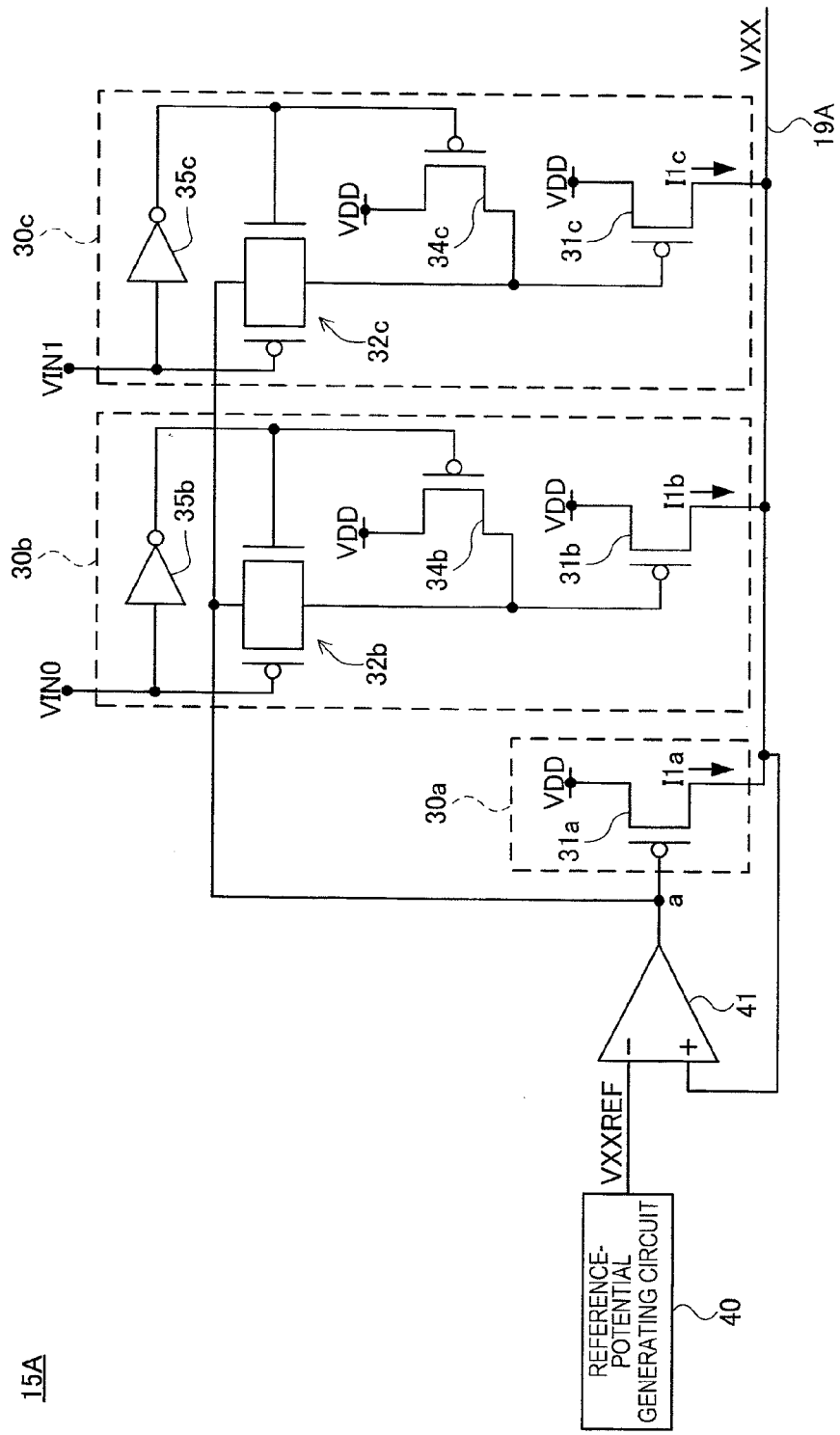
FIG. 3 is a circuit diagram of the internal-power-supply generating circuit (a step-down regulator) according to an embodiment of the present invention.

FIG. 3 is a circuit diagram of the internal-power-supply generating circuit 15A (the step-down regulator).

As shown in FIG. 3, the internal-power-supply generating circuit 15A includes a reference-potential generating circuit 40 and an operational amplifier 41, as well as the power supply units 30a to 30c. The power supply units 30a to 30c respectively include P-channel MOS transistors 31a to 31c, which are driver transistors.

The power supply unit 30b further includes a transfer gate 32b consisting of a P-channel MOS transistor and an N-channel MOS transistor connected in parallel each other, a P-channel MOS transistor 34b that pulls up the control electrode (a gate) of the driver transistor 31b, and an inverter 35b. The transfer gate 32b and the transistor 34b correspond to a first switch element connected to the gate of the driver transistor 31b. Similarly, the power supply unit 30c includes a transfer gate 32c, a P-channel MOS transistor 34c that pulls up the gate of the driver transistor 31c, and an inverter 35c. The transfer gate 32c and the transistor 34c correspond to a first switch element connected to the gate of the driver transistor 31c.

The driver transistors 31a to 31c are connected in parallel between the external power supply wiring 19X (FIG. 1) to which the voltage VDD is supplied and the internal power supply wiring 19A that supplies the internal power supply voltage VXX. The gate of the driver transistor 31a is directly connected to a contact point "a" that is connected to the output terminal of the operational amplifier 41. The gate of the driver transistor 31b is connected to the contact point "a" via transfer gate 32b. Similarly, the gate of the driver transistor 31c is connected to the contact point "a" via the transfer gate 32c.

A predetermined bit signal VIN0 constituting the code signal VINn is supplied to the transfer gate 32b. The same bit signal VIN0 is supplied to the transistor 34b via the inverter 35b. Accordingly, the transfer gate 32b is turned ON and the pull-up transistor 34b is turned OFF when the bit signal VIN0 is at a low level, whereby the power supply unit 30b is activated. When the bit signal VIN0 is at a high level, the transfer gate 32b is turned OFF and the pull-up transistor 34b is turned ON, whereby the power supply unit 30b is deactivated. Similarly, a bit signal VIN1 constituting the code signal VINn is supplied to the power supply unit 30c (the transfer gate 32c and the transistor 34c), and the power supply unit 30c is activated or deactivated according to its logic level.

The reference-potential generating circuit 40 is a circuit that generates a reference potential VXXREF of the internal power supply voltage VXX and inputs the reference potential VXXREF to the inverting input terminal of the operational amplifier 41. The non-inverting input terminal of the operational amplifier 41 is connected to the internal power supply wiring 19A that supplies the internal power supply voltage VXX. Therefore, potential of the internal power supply voltage VXX becomes equal to the reference potential VXXREF due to a virtual short circuit of the operational amplifier 41.

The operational amplifier 41 constitutes a constant current circuit, together with driver transistors included in the activated power supply units 30b and 30c, as well as the driver transistor 31a. When both of the power supply units 30b and 30c are activated, for example, the operational amplifier 41 constitutes a constant current circuit together with the driver transistors 31a to 31c, where the maximum value of the current flowing in the internal power supply wiring 19A is IIa+IIb+IIc. Note that IIa to IIc are saturation currents of the driver transistors 31a to 31c, respectively. When only the power supply unit 30b is activated, for example, the operational amplifier 41 constitutes a constant current circuit together with the driver transistors 31a and 31b, where the maximum value of the current flowing in the internal power supply wiring 19A is IIa+IIb. This is similarly applied to cases when only the power supply unit 30c is activated or when the power supply units 30b and 30c are both deactivated, and in these cases, the maximum value of the current flowing the internal power supply wiring 19A becomes IIa+ IIc, IIa, respectively.

The current supply capability of the internal-power-supply generating circuit 15A is represented by the maximum value of the current flowing in the internal power supply wiring 19A. Therefore, the current supply capability of the internal-power-supply generating circuit 15A can be adjusted by the value of the bit signals VIN and VIN1.

The tester 20 obtains an optimal value of the bit signals VIN0 and VIN1 by the processes up to step S8 of FIG. 2, and the fuse trimming of the fuse circuit 14 is performed at step S11 based on the optimal value. In this way, a code signal VFUSEn indicating the power supply unit to be activated among the power supply units 30b and 30c is thereby written into the fuse circuit 14 in a non-volatile manner.

While an example of a step-down regulator having three driver transistors is shown in FIG. 3, the number of driver transistors included in a step-down regulator is not limited to three and can be any number equal to or larger than two.

When the internal-power-supply generating circuit 15A is a step-down regulator, it is preferred to adjust the drive capability of the operational amplifier 41 in conjunction with the current supply capability. This adjustment is described below in detail.

Figure 4:
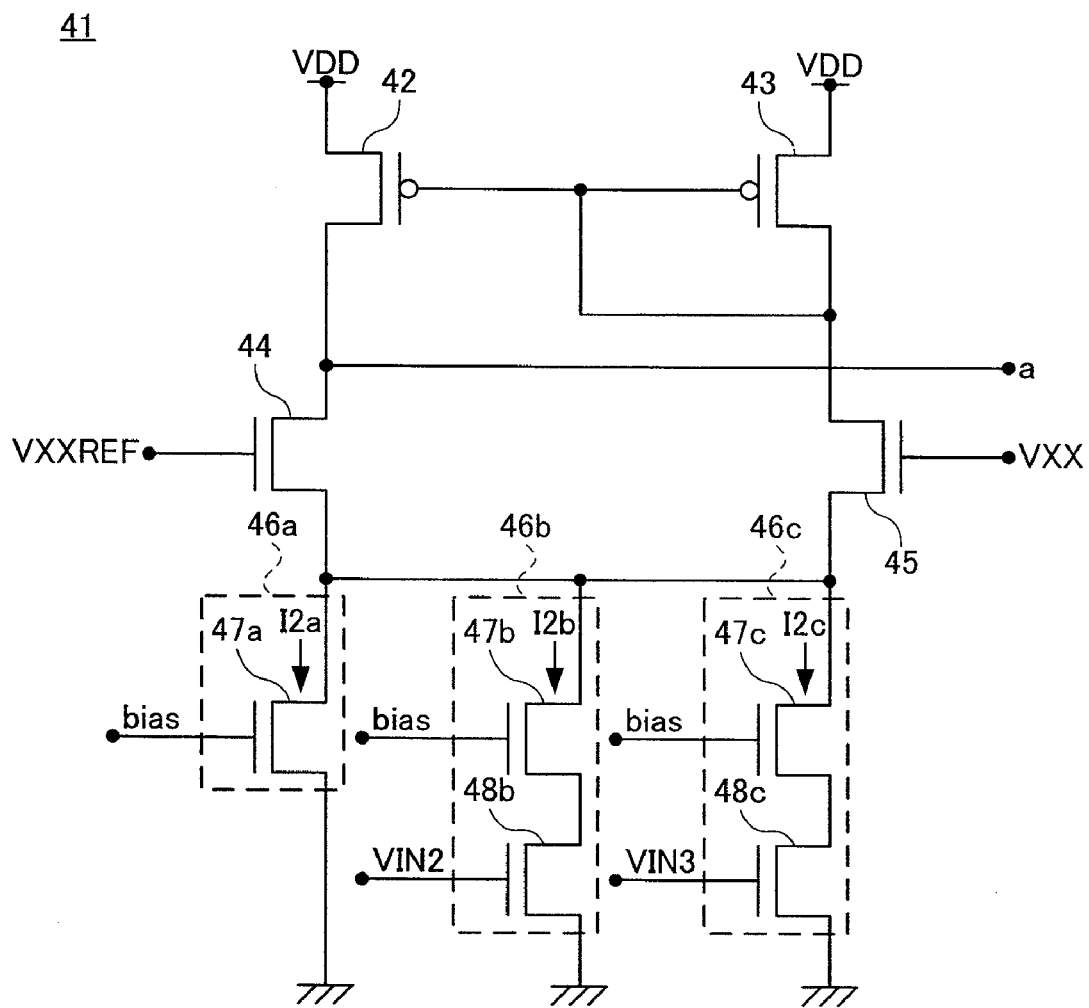
FIG. 4 is a circuit diagram of an internal circuit of the operational amplifier described in FIG. 3.

FIG. 4 is a circuit diagram of an internal circuit of the operational amplifier 41. As shown in FIG. 4, the operational amplifier 41 has a current mirror circuit including P-channel MOS transistors 42 and 43, and a differential circuit including N-channel MOS transistors 44 and 45 and current extracting units (bias current supply units) 46a to 46c. The current extracting units 46a to 46c respectively include N-channel MOS transistors 47a to 47c, which are extracting transistors.

The current extracting units 46b and 46c further include N-channel MOS transistors 48b and 48c, respectively. The transistors 48b and 48c each correspond to a second switch element connected in series to the extracting transistors 47b and 47c.

The current extracting units 46a to 46c are provided for each of the power supply units 30a to 30c in the step-down regulator. The size ratio of the extracting transistors 47a to 47c is designed to be equal to that of the driver transistors 31a to 31c.

In the operational amplifier 41, drains of the transistor 42 and the transistor 44 are connected to each other, and drains of the transistor 43 and the transistor 45 are connected to each other. The gate of the transistor 44 constitutes a non-inverting input terminal of the operational amplifier 41, having the potential VXXREF input from the reference-potential generating circuit 40 (FIG. 3). Further, the gate of the transistor 45 constitutes an inverting input terminal of the operational amplifier 41, with the potential VXX being input from the power supply wiring. The output (the contact point "a") of the operational amplifier 41 is taken from the drain of the transistor 42 (the drain of the transistor 44).

Predetermined bias voltages are respectively applied to each gate of the transistors 47a to 47c, whereby the transistors 47a to 47c are saturated. Therefore, the value of an ON-state current of the transistors 47a to 47c is constant.

A predetermined bit signal VIN2 constituting the code signal VINn is supplied to the gate of the transistor 48b. Accordingly, when the bit signal VIN2 is at a low level, the transistor 47b is disconnected from the ground, thereby deactivating the current extracting unit 46b. On the other hand, when the bit signal VIN2 is at a high level, the transistor 47b is connected to the ground, thereby activating the current extracting unit 46b. Similarly, a predetermined bit signal VIN3 constituting the code signal VINn is supplied to the gate of the transistor 48c, and the current extracting unit 46c is activated or deactivated according to its logic level.

The extraction current (bias current) of the operational amplifier 41 is the sum of a drain current I2a of the current extracting unit 46a and drain currents I2b and I2c of the activated current extracting units 46b and 46c. Therefore, the value of the extraction current of the operational amplifier 41 can be adjusted according to the value of the bit signals VIN2 and VIN3. Because the drive capability of the operational amplifier 41 can be expressed by the value of the extraction current, it becomes possible to adjust the drive capability of the operational amplifier 41 according to the value of the bit signals VIN2 and VIN3.

At step S11 of FIG. 2, the tester 20 determines specific values of the bit signals VIN2 and VIN3, based on the optimal value of the bit signals VIN0 and VIN1 obtained by the processes up to step S8. The values of the bit signals VIN2 and VIN3 are determined in this manner, in order to adjust the drive capability of the operational amplifier 41 in conjunction with an adjustment of the current supply capability. Specifically, when the power supply unit 30b is activated (VIN0=low), the current extracting unit 46b is also activated (VIN2=high), whereas the current extracting unit 46b is also deactivated (VIN2=low) when the power supply unit 30b is deactivated (VIN0=high). Similarly, when the power supply unit 30c is activated (VIN1=low), the current extracting unit 46c is also activated (VIN4=high), whereas the current extracting unit 46c is also deactivated (VIN4=low) when the power supply unit 30c is deactivated (VIN1=high). At step S11 of FIG. 2, fuse trimming of the fuse circuit 14 based on specific values of the bit signals VIN2 and VIN3 obtained as described above is performed. The code signal VFUSEn indicating the current extracting unit to be activated among the current extracting units 46b and 46c is thus written into the fuse circuit 14 in a non-volatile manner.

As described above, it becomes possible to stabilize the response speed of the step-down regulator by adjusting the drive capability (the value of extraction current) of the operational amplifier 41 in conjunction with an adjustment of the current supply capability of the step-down regulator. That is, the higher the drive capability of the operational amplifier 41 is, the faster the response speed of the step-down regulator becomes. On the other hand, the response speed of the step-down regulator becomes slower as the current supply capability is increased. Therefore, the response speed of the step-down regulator can be stabilized by raising the drive capability of the operational amplifier 41 as the current supply capability of the step-down regulator increases. Furthermore, because the drive capability of the operational amplifier 41 is not increased more than necessary, the amount of consumption current of the operational amplifier 41 is optimized.

Figure 5:
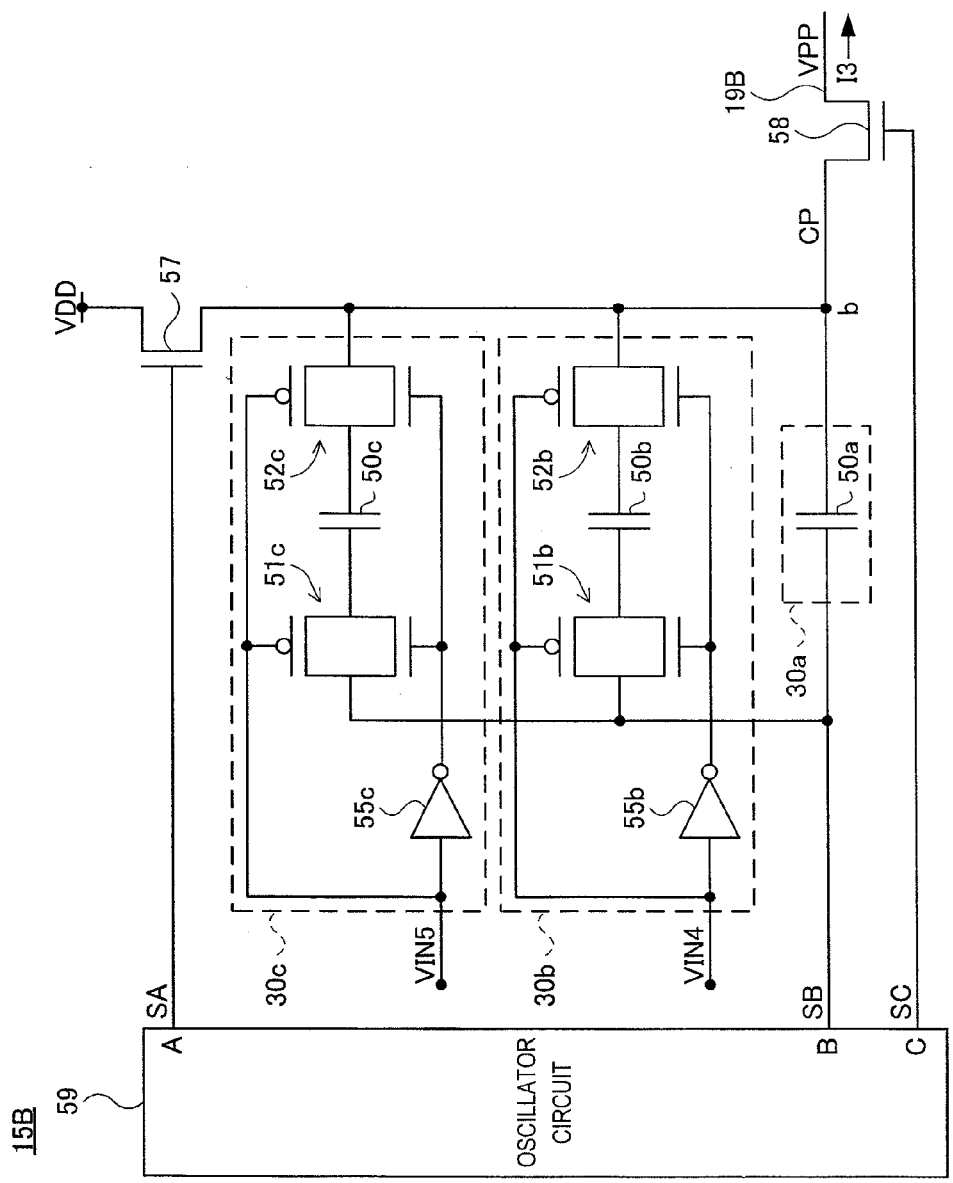
FIG. 5 is a circuit diagram of the internal-power-supply generating circuit (a VPP generator) according to an embodiment of the present invention.

FIG. 5 is a circuit diagram of the internal-power-supply generating circuit 15B (the VPP generator).

As shown in FIG. 5, the internal-power-supply generating circuit 15B as a VPP generator includes N-channel MOS transistors 57 and 58, and an oscillator circuit 59, in addition to the power supply units 30a to 30c. The power supply units 30a to 30c respectively include capacitors 50a to 50C.

The power supply unit 30b further includes an inverter 55b and transfer gates 51b and 52b respectively having a P-channel MOS transistor and an N-channel MOS transistor connected in parallel thereto. The transfer gates 51b and 52b each correspond to a third switch element connected in series to the capacitor 50b. Similarly, the power supply unit 30c includes transfer gates 51c and 52c respectively having a P-channel MOS transistor and an N-channel MOS transistor connected in parallel thereto, and an inverter 55c. The transfer gates 51c and 52c each correspond to a third switch element connected in series to the capacitor 50c.

The oscillator circuit 59 includes three output terminals A to C. The output terminal A is connected to the gate of the N transistor 57, and the output terminal B is connected to a contact point b. The output terminal C is connected to the gate of the N transistor 58.

Figure 6:
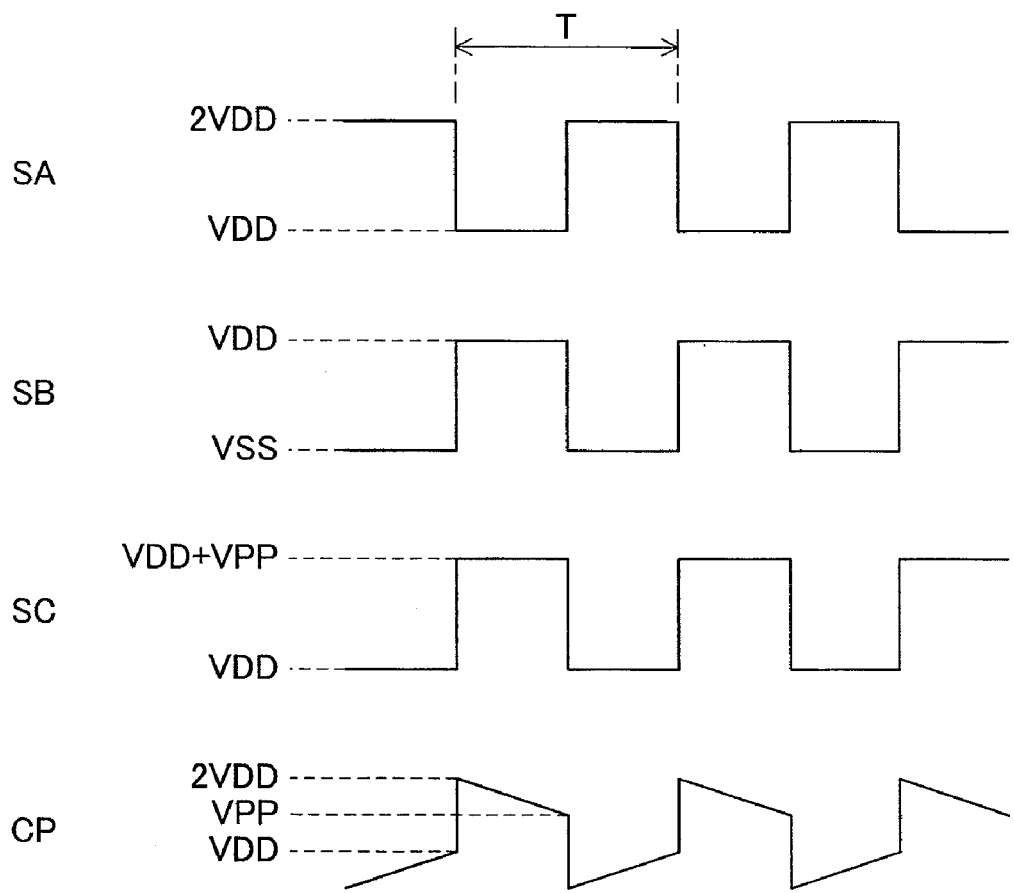
FIG. 6 shows waveforms of signals output to output terminals by an oscillator circuit described in FIG. 5.

FIG. 6 shows waveforms of signals SA to SC output to the output terminals A to C by the oscillator circuit 59. As shown in FIG. 6, the output signals SA to SC are periodic rectangular signals all having a cycle T. The output signal SA is a periodic rectangular signal varying between potentials 2VDD and VDD with the cycle T. The output signal SB is a periodic rectangular signal varying between potentials VDD and VSS with the cycle T. The output signal SC is a periodic rectangular signal varying between potentials VDD+VPP and VDD with the cycle T. The output signals SA to SC synchronize with each other and, when the output signal SA is the potential 2VDD, the output signals SB and SC respectively become the potentials VSS and VDD.

The contact point b is connected, via the transistor 58, to an internal power supply wiring 19B that supplies the internal power supply voltage VPP. The transistor 57 is inserted between the contact point b and the external power supply wiring to which the external power supply voltage VDD is supplied. The threshold voltage of the transistor 57 is set to an intermediate voltage between the potentials 2VDDP and VDDP. The threshold voltage of the transistor 58 is set to an intermediate voltage between the potentials VDDP+VPP and VDDP.

The capacitors 50a to 50c are connected in parallel between the contact point b and the output terminal B. The transfer gates 51b and 52b are connected in series to the capacitor 50b. The transfer gate 51b is connected between the capacitor 50b and the output terminal B, whereas the transfer gate 52b is connected between the capacitor 50b and the contact point b. Similarly, the transfer gates 51c and 52c are connected in series to the capacitor 50c. The transfer gate 51c is connected between the capacitor 50c and the output terminal B, whereas the transfer gate 52c is connected between the capacitor 50c and the contact point b.

The internal-power-supply generating circuit 15B is a circuit that generates a signal CP having a sawtooth potential shown in FIG. 6 at the contact point b by repeating a charge operation and a pumping operation with the cycle T.

First, the following descriptions focus on the power supply unit 30a. Because the transistor 57 is turned ON and the transistor 58 is turned OFF when the output signals SA to SC respectively have the potentials 2VDD, VSS, and VDD, the potential of the contact point b is charged to VDD as shown in FIG. 6 (the charge operation). Because the transistor 57 is turned OFF and the transistor 58 is turned ON when the output signals SA to SC respectively change to the potentials VDD, VDD, and VDD+VPP after the charge operation, the total voltage 2VDD of the potential VDD that has been charged in the capacitor 50a and the voltage VDD of the output signal B is output to the power supply wiring (the pumping operation). By alternately repeating such an operation, the internal power supply voltage VPP, which is the output of the internal-power-supply generating circuit 15B, is raised to twice the external power supply voltage VDD.

A predetermined bit signal VIN0 constituting the code signal VINn is supplied to the transfer gates 51b and 52b. Accordingly, the transfer gates 51b and 52b are turned ON when the bit signal VIN0 is at a low level, thereby activating the power supply unit 30b. On the other hand, the transfer gates 51b and 52b are turned OFF when the bit signal VIN0 is at a high level, thereby deactivating the power supply unit 30b. Similarly, a bit signal VIN5 constituting the code signal VINn is supplied to the power supply unit 30c (the transfer gates 51c and 52c), and the power supply unit 30c is activated or deactivated according to its logic level.

The value of a current I3 supplied to the power supply wiring from the internal-power-supply generating circuit 15B varies depending on whether the power supply units 30b and 30c are activated. When both of the power supply units 30b and 30c are activated, for example, the value of the current I3 is expressed by the following equation (1). In the equation (1), CA to CC are capacities of the capacitors 50a to 50c, respectively.

$$I3 = (2VDD - VPP) \times (CA + CB + CC)/T \quad (1)$$

The value of the current I3 when one or both of the power supply units 30b and 30 are deactivated is the value with the capacities of the corresponding capacitors 50b and 50c set to zero in the equation (1).

The value of the current I3 expresses the current supply capability of the internal-power-supply generating circuit 15B. The amount of consumption current of the internal-power-supply generating circuit 15B is twice the current I3. Using such a characteristic of the current I3 in the internal-power-supply generating circuit 15B, the current supply capability can be adjusted by switching between activation and deactivation of the power supply units 30b and 30c according to the value of the bit signals VIN0 and VIN1.

The tester 20 obtains an optimal value of the bit signals VIN0 and VIN5 by the processes up to step S8 of FIG. 2 and fuse trimming of the fuse circuit 14 based on the optimal value is preformed at step S11. A code signal VFUSEn indicating the power supply unit to be activated among the power supply units 30b and 30c is thus written into the fuse circuit 14 in a non-volatile manner.

A second embodiment of the present invention is described next. The second embodiment particularly focuses on the fact that the current I3 of the internal-power-supply generating circuit 15B that is the VPP generator is expressed by the equation (1), and the second embodiment adjusts the current supply capability of the internal-power-supply generating circuit 15B by adjusting the cycle T, not by adjusting the capacity. While the functional block of the semiconductor device according to the second embodiment is similar to that shown in FIG. 1, it is not essential that the internal-power-supply generating circuit 15B includes a plurality of power supply units.

Figure 7:
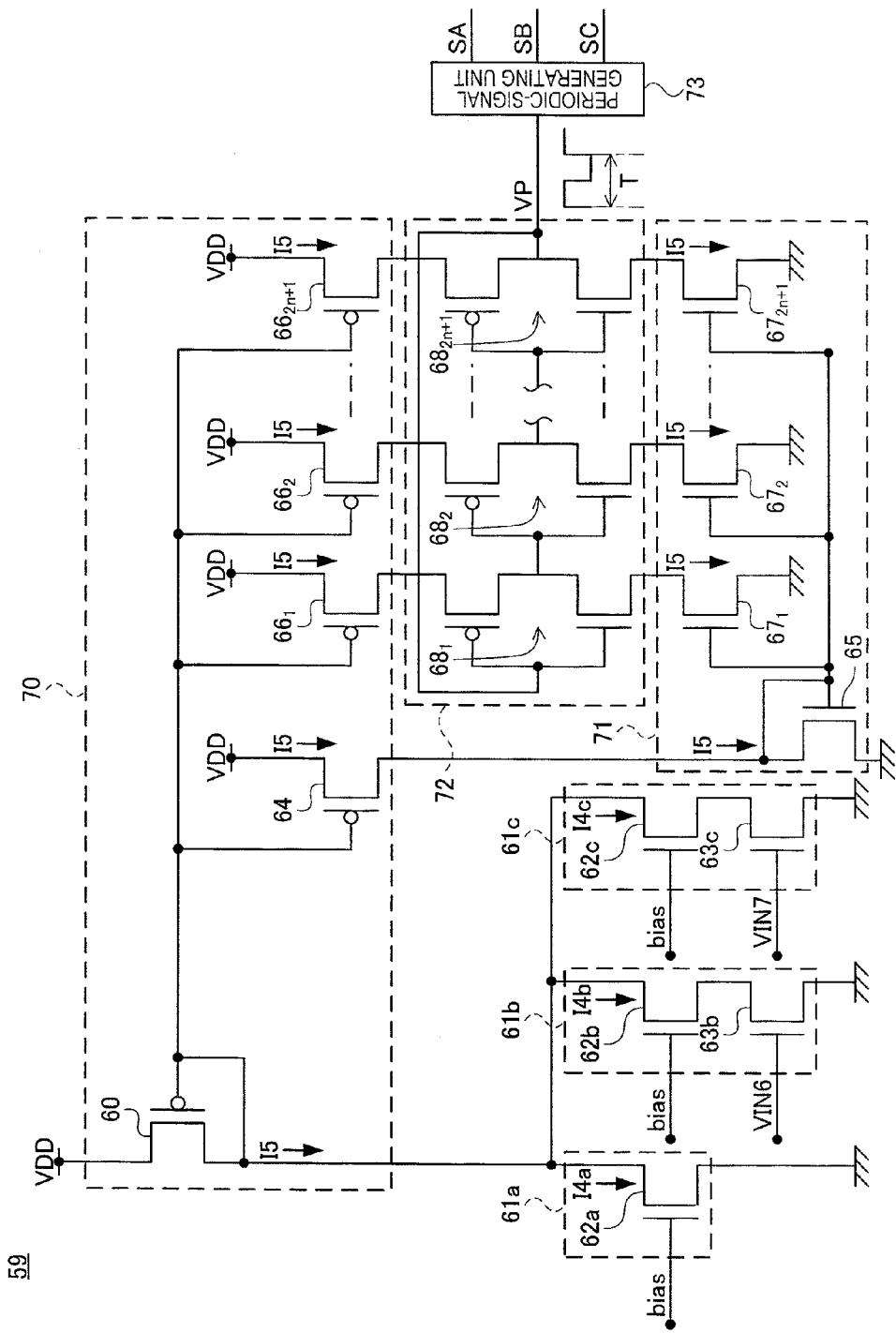
FIG. 7 is a circuit diagram of an internal circuit of an oscillator circuit according to an embodiment of the present invention.

FIG. 7 is a circuit diagram of an internal circuit of the oscillator circuit 59 shown in FIG. 5.

As shown in FIG. 7, the oscillator circuit 59 includes current extracting units (bias current supply units) 61a to 61c, current mirror circuits 70 and 71, an oscillator circuit 72, and a periodic-signal generating unit 73. The current extracting units 61 to 61c respectively include N-channel MOS transistors 62a to 62c, which are extracting transistors.

The current extracting units 61b and 61c further include N-channel MOS transistors 63b and 63c, respectively. The transistors 63b and 63c each correspond to a fourth switch element connected in series to the extracting transistors 62b and 62c.

The current mirror circuit 70 includes P-channel MOS transistors 60 and 64 and $66_1$ to $66_{2n+1}$ (n is a natural number), which are connected in parallel. The current mirror circuit 71 includes N-channel MOS transistors 65, and $67_1$ to $67_{2n+1}$ connected in parallel. The oscillator circuit 72 includes inverter circuits $68_1$ to $68_{2n+1}$ having a P-channel MOS transistor and an N-channel MOS transistor connected in series thereto.

The inverter circuits $68_k$ (k=1 to 2n+1) included in the oscillator circuit 72 are connected in cascade to each other, and the output of the inverter circuit $68_{2n+1}$ is feedback-connected to the input of the inverter circuit $68_1$. The source of the P-channel MOS transistor constituting the inverter circuit $68_k$ is connected to the external power supply wiring 19X via the corresponding transistor $66_k$, whereas the source of the N-channel MOS transistor constituting the inverter circuit $68_k$ is connected to the ground via a corresponding transistor $67_k$.

The external power supply wiring 19X is connected to the source of the transistor 60 included in the current mirror circuit 70, and the current extracting units 61a to 61c are connected in parallel to the drain of the transistor 60. The transistors 64 and 65 are connected in series between the external power supply wiring 19X and the ground.

A predetermined bias voltage is applied to respective gates of the transistors 62a to 62c, whereby the transistors 62a to 62c are saturated. Therefore, the value of the ON-state current of the transistors 62a to 62c is constant.

A predetermined bit signal VIN6 constituting the code signal VINn is supplied to the gate of the transistor 63b. Accordingly, the transistor 62b is disconnected from the ground when the bit signal VIN6 is at a low level, thereby deactivating the current extracting unit 61b. When the bit signal VIN6 is at a high level, the transistor 62b is connected to the ground, thereby activating the current extracting unit 61b. Similarly, a predetermined bit signal VIN7 constituting the code signal VINn is supplied to the gate of the transistor c, and the current extracting unit 61c is activated or deactivated according to its logic level.

With the above configuration, a common current I5 flows in the inverter circuits $68_1$ to $68_{2n+1}$, where the value of the current I5 is the sum of a drain current I4a of the current extracting unit 61a and drain currents I4b and I4c of the activated current extracting units 61b and 61c. Therefore, it becomes possible to adjust the value of the current I5 (the drive capability of the oscillator circuit 59) by the value of the bit signals VIN6 and VIN7.

The oscillator circuit 72 generates a periodic signal VP in the output of the inverter circuit $68_{2n+1}$ at the last stage by iteratively switching ON and OFF the two transistors in each of the inverter circuit $68_k$, where the cycle T of the periodic signal VP is reverse-proportional to the value of the current I5. That is, the larger the value of the current I5 is, the shorter the cycle T becomes. This means that the cycle T of the periodic signal VP can be adjusted by switching the value of the bit signals VIN6 and VIN7, and thus the current supply capability of the internal-power-supply generating circuit 15B can be adjusted using the bit signals VIN6 and VIN7 according to the equation (1).

The process flow of the tester 20 at the time of wafer test is similar to that shown in FIG. 2. The tester 20 obtains optimal values of the bit signals VIN6 and VIN7 by the processes up to step S8, and fuse trimming of the fuse circuit 14 based on the optimal values is performed at step S11. The code signal VFUSEn indicating the current extracting unit to be activated among the current extracting units 61b and 61c is thus written into the fuse circuit 14 in a non-volatile manner.

The periodic-signal generating unit 73 is a circuit that generates the periodic signals SA to SC shown in FIG. 6, based on the periodic signal VP output from the oscillator circuit 72. The cycle of these periodic signals SA to SC are equal to the cycle T of the periodic signal VP.

It is apparent that the present invention is not limited to the above embodiments, but may be modified and changed without departing from the scope and spirit of the invention.

In the above embodiments, for example, activation information of the power supply unit is written into the fuse circuit 14; however, the fuse circuit described above includes a laser trimming fuse or an electrically disconnecting/conducting fuse (including an anti-fuse).

In addition, while the constantly activated current supply unit 30a is provided in the above embodiments, all of the current supply units can be configured to be activatable and deactivatable. The same is true for the current extracting unit.

When the semiconductor device 10 according to the above embodiments is a DRAM, a semiconductor memory test for detecting defective cells can be performed simultaneously with the determining operation using the tester 20.

Figure 8:
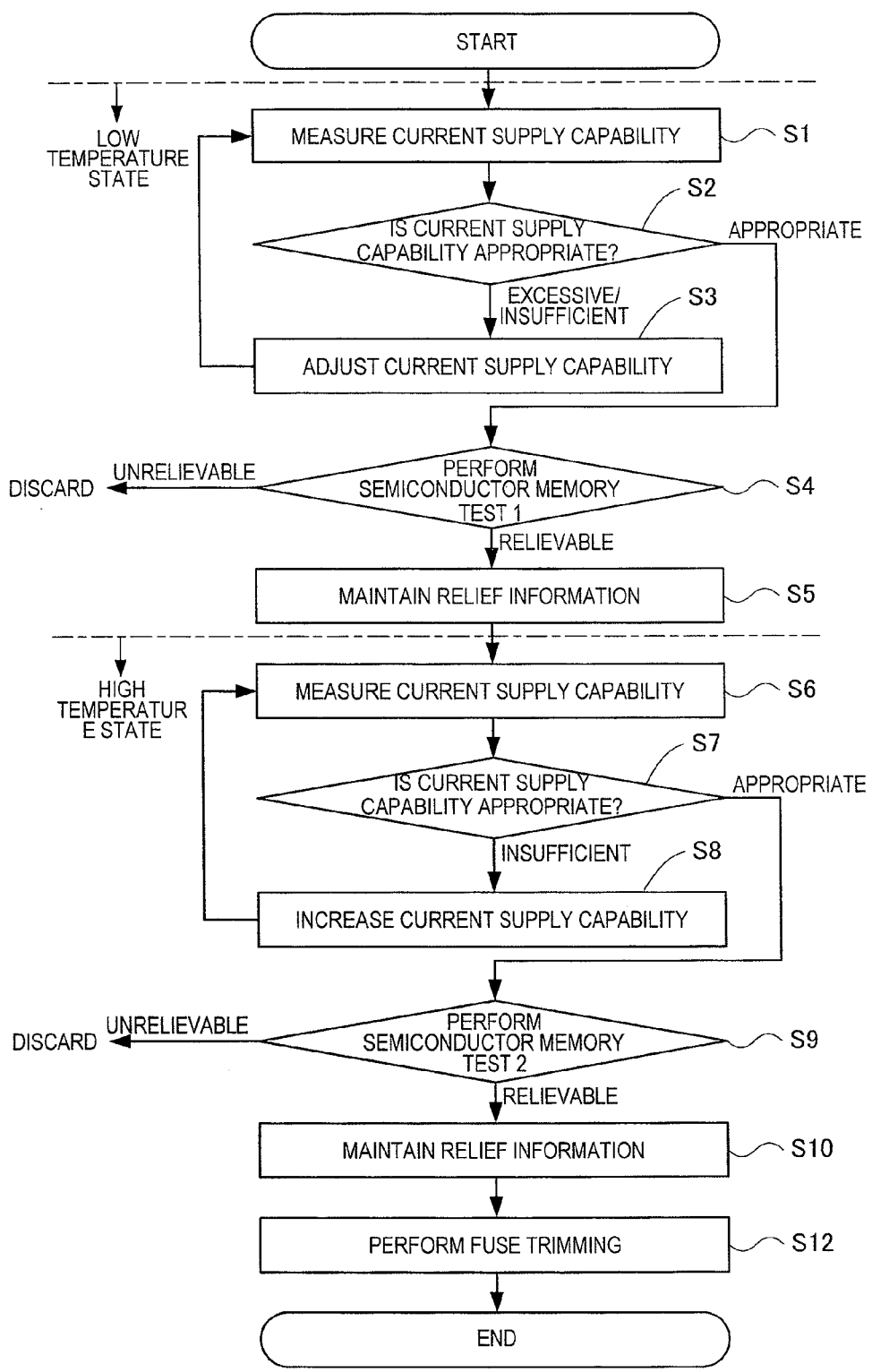
FIG. 8 is a flowchart of an adjusting operation of the current supply capability of a semiconductor device according to a modification of an embodiment of the present invention.

FIG. 8 is a flowchart of a process flow of the tester 20 in the example of performing a semiconductor memory test simultaneously with a determining operation. In FIG. 8, processes identical to those in the process flow shown in FIG. 2 are denoted by like reference characters in FIG. 2.

As shown in FIG. 8, the tester 20 first adjusts the current supply capability of the internal-power-supply generating circuit 15A in a low temperature state (steps S1 to S3), and subsequently performs the first semiconductor memory test (step S4). In this way, the address of a defective cell in the low temperature state is detected, and when the defective cell is relievable by replacing the cell with a redundant cell, relief information is maintained (step S5) in the register 21 (FIG. 1). On the other hand, when it is impossible to relieve the defective cell, the semiconductor device 10 itself is discarded as a defective item.

Next, after having switched to a high temperature state, the tester 20 adjusts the current supply capability of the internal-power-supply generating circuit 15A again (steps S6 to S8) and subsequently performs the second semiconductor memory test (step S9). In this way, the address of a defective cell in the high temperature state is detected, and when the defective cell can be relieved by replacing the cell with a redundant cell, relief information is maintained (step S10) in the register 21 (FIG. 1). On the other hand, when it is impossible to relieve the defective cell, the semiconductor device 10 itself is discarded as a defective item.

Fuse trimming is then performed (step S12) finally, where not only fuse trimming for adjusting the current supply capability (and the extraction current), but also fuse trimming is performed on the relief information that has been maintained at steps S5 and S10.

As described above, it becomes possible to perform fuse trimming for adjusting the current supply capability (and the extraction current), simultaneously with fuse trimming on relief information of a defective cell by performing a semiconductor memory test simultaneously with determination of the current supply capability. Therefore, manufacturing time of the semiconductor device 10 can be shortened.

In addition, while not specifically claimed in the claim section, the applicant reserves the right to include in the claim section of the application at any appropriate time the following methods:

A manufacturing method of a semiconductor device having an internal power supply circuit configured to be capable of controlling a value of a current for generating an internal power supply voltage according to bit data, the method comprising:

maintaining first bit data that sets the value of the current within a first range at a first temperature; and determining whether a value of a current in the internal power supply circuit corresponding to the first bit at a second temperature, which is higher than the first temperature, falls within the first range.

What is claimed is:

1. A semiconductor device comprising:
an internal circuit supplied with a power supply voltage;
an internal power supply wiring connected to the internal circuit;
a plurality of power supply units connected in common to the internal power supply wiring to supply the internal circuit with the power supply voltage via the internal power supply wiring;
a control circuit that activates or deactivates each of the power supply units, wherein each of the power supply units includes a driver transistor connected between an external power supply wiring to which an external voltage is supplied and the internal power supply wiring, and the control circuit activates or deactivates each of the power supply unit by turning on or off the driver transistors included therein, and wherein sizes of the driver transistors included in the power supply units are different from each other; and
an operational amplifier including two input terminals that receives the power supply voltage from the internal power supply wiring and a reference potential of the power supply voltage, respectively, wherein
each of the power supply units further includes a first switch element provided between a control electrode of the driver transistor included therein and an output terminal of the operational amplifier, and
the control circuit activates or deactivates each of the power supply units by turning on or off the first switch element thereof.

2. The semiconductor device as claimed in claim 1, wherein the control circuit controls drive capability of the operational amplifier.

3. The semiconductor device as claimed in claim 2, wherein the control circuit controls drive capability of the operational amplifier by controlling a value of a bias current of the operational amplifier.

4. The semiconductor device as claimed in claim 3, wherein
the operational amplifier further includes a plurality of bias current supply units respectively including a bias transistor, and
the control circuit controls an amount of the bias current of the operational amplifier by selecting either activation or deactivation of the bias current supply units.

5. The semiconductor device as claimed in claim 4, wherein
each of the bias current supply units further includes a second switch element connected in series to the bias transistor included therein, and
the control circuit activates or deactivates each of the bias current supply units by turning on or off the second switch element thereof.

6. The semiconductor device as claimed in claim 2, wherein the control circuit activates or deactivates each of the power supply units in conjunction with control of drive capability of the operational amplifier.

7. The semiconductor device as claimed in claim 1, wherein
each of the power supply units includes a capacitor, and
the internal power supply circuit supplies the power supply voltage using one or more capacitors each included in activated one or more of the power supply units.

8. The semiconductor device as claimed in claim 7, wherein each of the power supply units serves as a pumping circuit that generates the power supply voltage by charging and discharging the capacitor included therein using a periodic signal.

9. The semiconductor device as claimed in claim 8, wherein
each pumping circuit includes a third switch element connected in series to the capacitor included therein, and
the control circuit activates or deactivates each pumping circuit by turning on or off the third switch element included therein.

10. The semiconductor device as claimed in claim 1, wherein the control circuit activates or deactivates each of the power supply units based on stored contents of a storage circuit that stores activation information of each of the power supply units.

11. The semiconductor device as claimed in claim 10, wherein the control circuit further activates or deactivates each of the power supply units based on a test code signal supplied from outside.

12. A semiconductor device comprising:
an internal circuit supplied with a power supply voltage;
an internal power supply wiring connected to the internal circuit;
an oscillator circuit that generates a periodic signal having a predetermined cycle, the predetermined cycle being controlled by drive capability thereof;
a pumping circuit that generates the power supply voltage by charging and discharging one or more capacitors using the periodic signal generated by the oscillator circuit, and supplies the internal circuit with the power supply voltage via the internal power supply wiring; and
a control circuit that controls the drive capability of the oscillator circuit.

13. The semiconductor device as claimed in claim 12, wherein the control circuit controls drive capability of the oscillator circuit by controlling a value of a bias current of the oscillator circuit.

14. The semiconductor device as claimed in claim 13, wherein
the oscillator circuit includes a plurality of bias current supply units respectively including a bias transistor, and
the control circuit controls an amount of a bias current of the oscillator circuit by selecting either activation or deactivation of at least a part of the bias current supply units.

15. The semiconductor device as claimed in claim 14, wherein
each of said at least the part of the bias current supply units the oscillator circuit further includes a fourth switch element connected in series to the bias transistor, and
the control circuit activates or deactivates each of said at least the part of the bias current supply units by turning on or off the fourth switch element thereof.

16. The semiconductor device as claimed in claim 14, wherein the control circuit activates or deactivates each of said at least the part of the bias current supply units based on stored contents of a storage circuit that stores activation information of each of said at least the part of the bias current supply units.

17. The semiconductor device as claimed in claim 14, wherein the control circuit activates or deactivates each of said at least the part of the bias current supply units based on a test code signal supplied from outside.

18. A manufacturing method of a semiconductor device having an internal power supply circuit, the internal power supply circuit includes:
- a plurality of power supply units connected in common to an internal power supply wiring that supplies a power supply voltage to an internal circuit of the semiconductor device; and
- a storage circuit that stores activation information of each of at least a part of the power supply units, wherein the method comprising:

activating a part or all of the power supply units;

measuring current supply capability of the internal power supply circuit; and writing the activation information into the storage circuit based on a measurement result.

19. The manufacturing method of a semiconductor device as claimed in claim 18, wherein the activating includes:
- activating a part or all of the power supply units in a state where ambient temperature is set to a first temperature; and
- activating a part or all of the power supply units in a state where ambient temperature is set to a second temperature, which is different from the first temperature, wherein the activation information is written into the storage circuit based on respective measurement results at the first and second temperatures.

* * * * *